US009891102B2

(12) United States Patent
Kim et al.

(10) Patent No.: US 9,891,102 B2
(45) Date of Patent: *Feb. 13, 2018

(54) SIMPLIFIED LIGHT SENSING CIRCUIT, LIGHT SENSING APPARATUS INCLUDING THE LIGHT SENSING CIRCUIT, METHOD OF DRIVING THE LIGHT SENSING APPARATUS, AND IMAGE ACQUISITION APPARATUS AND OPTICAL TOUCH SCREEN APPARATUS INCLUDING THE LIGHT SENSING APPARATUS

(75) Inventors: Young Kim, Yongin-si (KR); I-hun Song, Seongnam-si (KR); Seung-eon Ahn, Hwaseong-si (KR); Sang-hun Jeon, Seoul (KR); Chang-jung Kim, Yongin-si (KR); Sung-ho Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 809 days.

This patent is subject to a terminal disclaimer.

(21) Appl. No.: 13/545,623

(22) Filed: Jul. 10, 2012

(65) Prior Publication Data
US 2012/0274608 A1 Nov. 1, 2012

Related U.S. Application Data

(63) Continuation-in-part of application No. 12/926,922, filed on Dec. 17, 2010.

(30) Foreign Application Priority Data

Apr. 22, 2010 (KR) ........................ 10-2010-0037531
Jul. 25, 2011 (KR) ........................ 10-2011-0073779

(51) Int. Cl.
*G09G 3/36* (2006.01)
*G01J 1/44* (2006.01)
(Continued)

(52) U.S. Cl.
CPC .............. *G01J 1/44* (2013.01); *G06F 3/0386* (2013.01); *G06F 3/042* (2013.01); *G06F 3/0412* (2013.01);
(Continued)

(58) Field of Classification Search
CPC ................ G09G 3/3648; H04N 5/3745; H01L 27/14609
(Continued)

(56) References Cited

U.S. PATENT DOCUMENTS 5,696,386 A * 12/1997 Yamazaki ........... H01L 21/2026
257/347
5,869,857 A * 2/1999 Chen .................. H01L 27/14609
250/214.1
(Continued)

FOREIGN PATENT DOCUMENTS

CN 101499498 A 8/2009
CN 101552278 A 10/2009
(Continued)

OTHER PUBLICATIONS

Dec. 5, 2012 Office Action issued in U.S. Appl. No. 12/926,922.
(Continued)

*Primary Examiner* — Michael J Eurice
(74) *Attorney, Agent, or Firm* — Harness, Dickey & Pierce, P.L.C.

(57) ABSTRACT

In a simplified light sensing circuit, a light sensing apparatus including the light sensing circuit, a method of driving the light sensing apparatus, and an image acquisition apparatus and optical touch screen apparatus including the light sensing apparatus, the light sensing circuit includes an oxide semiconductor transistor including a channel layer including an oxide semiconductor material, for each pixel. The oxide semiconductor transistor is configured to operate as a light (Continued)

sensing device that senses light and a switch that outputs light sensing data.

28 Claims, 9 Drawing Sheets

(51) Int. Cl.
  H01L 27/146 (2006.01)
  G06F 3/038 (2013.01)
  G06F 3/041 (2006.01)
  G06F 3/042 (2006.01)
  H01L 27/12 (2006.01)
  H01L 31/113 (2006.01)
  H04N 5/3745 (2011.01)

(52) U.S. Cl.
  CPC .... H01L 27/1225 (2013.01); H01L 27/14609 (2013.01); H01L 27/14681 (2013.01); H01L 31/1136 (2013.01); G09G 3/3648 (2013.01); H04N 5/3745 (2013.01)

(58) Field of Classification Search
  USPC .................................. 345/175; 702/85; 2/175
  See application file for complete search history.

(56) References Cited

U.S. PATENT DOCUMENTS

| | | | |
|---|---|---|---|
| 7,504,616 B2* | 3/2009 | Nakamura et al. | 250/214.1 |
| 7,863,611 B2* | 1/2011 | Abe et al. | 257/58 |
| 8,106,983 B2* | 1/2012 | Hirota et al. | 348/308 |
| 8,194,469 B2* | 6/2012 | Tanaka et al. | 365/185.3 |
| 2005/0200293 A1 | 9/2005 | Naugler et al. | |
| 2006/0113565 A1* | 6/2006 | Abe | H01L 29/7869 257/197 |
| 2006/0244693 A1 | 11/2006 | Yamaguchi et al. | |
| 2006/0262055 A1 | 11/2006 | Takahara | |
| 2006/0267948 A1* | 11/2006 | Takahashi | 345/168 |
| 2007/0235741 A1* | 10/2007 | Nakamura | B41J 2/45 257/79 |
| 2007/0252147 A1* | 11/2007 | Kim et al. | 257/59 |
| 2007/0272922 A1 | 11/2007 | Kim et al. | |
| 2008/0066972 A1 | 3/2008 | Abileah et al. | |
| 2008/0068359 A1* | 3/2008 | Yoshida | G09G 3/3406 345/204 |
| 2008/0074401 A1 | 3/2008 | Chung et al. | |
| 2008/0079001 A1* | 4/2008 | Umezaki | H01L 27/1214 257/59 |
| 2008/0079685 A1* | 4/2008 | Umezaki | G09G 3/3677 345/100 |
| 2008/0122803 A1 | 5/2008 | Izadi et al. | |
| 2008/0122804 A1* | 5/2008 | Kinoshita et al. | 345/175 |
| 2008/0211786 A1* | 9/2008 | Park et al. | 345/175 |
| 2008/0284719 A1* | 11/2008 | Yoshida | G02F 1/136277 345/102 |
| 2008/0284768 A1* | 11/2008 | Yoshida | G09G 3/2022 345/208 |
| 2008/0284929 A1* | 11/2008 | Kimura | G02F 1/13624 349/38 |
| 2009/0001469 A1* | 1/2009 | Yoshida | H01L 27/1214 257/347 |
| 2009/0086137 A1* | 4/2009 | Horiguchi et al. | 349/116 |
| 2009/0153708 A1* | 6/2009 | Hirota | H01L 27/14629 348/294 |
| 2009/0161051 A1 | 6/2009 | Fukunaga et al. | |
| 2009/0224245 A1* | 9/2009 | Umezaki | H01L 29/78678 257/59 |
| 2009/0224351 A1* | 9/2009 | Hsieh | H01L 27/14609 257/444 |
| 2009/0248344 A1* | 10/2009 | Hirabayashi et al. | 702/85 |
| 2009/0310007 A1* | 12/2009 | Matsui | G02F 1/13338 348/311 |
| 2010/0020044 A1 | 1/2010 | Abileah et al. | |
| 2010/0060611 A1 | 3/2010 | Nie | |
| 2010/0090996 A1 | 4/2010 | Chou et al. | |
| 2010/0097838 A1* | 4/2010 | Tanaka et al. | 365/112 |
| 2001/0057185 | 3/2011 | Peng et al. | |
| 2011/0057185 A1* | 3/2011 | Peng et al. | 257/43 |
| 2011/0141060 A1* | 6/2011 | Kim et al. | 345/175 |
| 2011/0261017 A1* | 10/2011 | Park et al. | 345/175 |
| 2012/0138919 A1* | 6/2012 | Lan | H01L 27/14609 257/43 |
| 2012/0274608 A1* | 11/2012 | Kim | G01J 1/44 345/175 |
| 2013/0063400 A1* | 3/2013 | Ahn | H01L 27/14609 345/175 |
| 2015/0279884 A1* | 10/2015 | Kusumoto | H01L 27/14616 257/43 |
| 2015/0311245 A1* | 10/2015 | Yamazaki | H01L 27/14632 257/43 |
| 2016/0093652 A1* | 3/2016 | Ikeda | H01L 27/14634 250/208.1 |
| 2016/0104734 A1* | 4/2016 | Hirose | H01L 27/1225 257/43 |
| 2016/0118425 A1* | 4/2016 | Kurokawa | H01L 27/14616 257/43 |
| 2016/0155759 A1* | 6/2016 | Yamazaki | H01L 29/7869 257/43 |

FOREIGN PATENT DOCUMENTS

| | | |
|---|---|---|
| CN | 101916765 A | 12/2010 |
| CN | 102110701 A | 6/2011 |
| EP | 2 341 542 A2 | 7/2011 |
| JP | 2005129948 A | 5/2005 |
| JP | 2006330649 A | 12/2006 |
| JP | 2007-316196 A | 12/2007 |
| JP | 2009-146100 A | 7/2009 |
| JP | 2009-182194 A | 8/2009 |
| JP | 2009-244638 A | 10/2009 |
| JP | 2010-014719 A | 1/2010 |
| JP | 2010-056303 A | 3/2010 |
| JP | 2011139052 A | 7/2011 |
| KR | 20020017778 A | 3/2002 |
| KR | 20020017781 A | 3/2002 |
| KR | 20080066150 A | 7/2008 |
| KR | 20090066227 A | 6/2009 |
| KR | 2009-0084708 A | 8/2009 |
| KR | 20100107058 A | 10/2010 |
| WO | WO 2007/120010 | 10/2007 |
| WO | WO-2009096608 A1 | 8/2009 |

OTHER PUBLICATIONS

Notice of Allowance for U.S. Appl. No. 12/926,922 dated Oct. 24, 2014.
U.S. Office Action dated May 7, 2013 for related U.S. Appl. No. 12/926,922.
U.S. Office Action dated Oct. 31, 2013 for related U.S. Appl. No. 12/926,922.
European Search Report dated Nov. 20, 2012 for Application No. 12177721.3-2203.
Notice of Allowance for corresponding U.S. Appl. No. 12/926,922 dated May 8, 2014.
Korean Office Action issued on Jan. 13, 2017 for corresponding Korean Patent Application No. 10-2011-0073779 and English translation thereof.
Japanese Office Action mailed on Jul. 25, 2016 for corresponding Japanese Patent Application No. 2012-154441 and English translation thereof.
Chinese Office Action mailed May 27, 2016 for corresponding Chinese Patent Application No. 201210201495.5 and English translation thereof.
Japanese Office Action issued on Feb. 28, 2017 for corresponding Japanese Office Action No. 2012-154441 and English translation thereof.

* cited by examiner

SIMPLIFIED LIGHT SENSING CIRCUIT, LIGHT SENSING APPARATUS INCLUDING THE LIGHT SENSING CIRCUIT, METHOD OF DRIVING THE LIGHT SENSING APPARATUS, AND IMAGE ACQUISITION APPARATUS AND OPTICAL TOUCH SCREEN APPARATUS INCLUDING THE LIGHT SENSING APPARATUS

CROSS-REFERENCE TO RELATED APPLICATIONS

This application is a continuation-in-part application of U.S. patent application Ser. No. 12/926,922, filed on Dec. 17, 2010, and claims priority under 35 U.S.C. § 119 to Korean Patent Application No. 10-2010-0037531, filed on Apr. 22, 2010 in the Korean Intellectual Property Office (KIPO) and Korean Patent Application No. 10-2011-0073779, filed on Jul. 25, 2011 in the KIPO, the entire contents of which are incorporated herein by reference.

BACKGROUND

1. Field

The present disclosure relates to a light sensing circuit having a simplified structure using an oxide semiconductor transistor capable of sensing light as a light sensing device, a light sensing apparatus including the light sensing circuit, a method of driving the light sensing apparatus, and an image acquisition apparatus and optical touch screen apparatus including the light sensing apparatus.

2. Description of the Related Art

Touch screen devices are devices which may directly receive input data through a screen by recognizing a position of, for example, a finger, a stylus, or the like, touching the screen and performing a particular process by a software routine. To this end, a touch screen device may be equipped with a touch panel to perform the above function. Such touch panels may include resistive overlay type touch panels, capacitive overlay type touch panels, surface acoustic wave (SAW) type touch panels, infrared beam type touch panels, piezoelectric type touch panels, or the like. The touch screen device is widely used in a variety of fields as an input device replacing a keyboard or a mouse.

A touch screen device that has been widely used employs a method of directly touching a screen of a display device using a finger or a stylus. However, as the size of a display device increases, the distance between the display device and a user may increase. In this case, use of the direct touch method may be difficult to adopt. Accordingly, optical touch screen devices have been proposed that may perform the same function as the existing touch screen by sensing light instead of sensing contact of a finger or a stylus. An optical touch screen device may facilitate communications not only between a user and a terminal but also between a user and a user.

In order to realize such an optical touch panel, a relatively small sized light sensing device for sensing light may be required. An amorphous silicon thin film transistor (a-Si TFT) is one of generally used light sensing devices. However, an a-Si TFT may not exhibit a sufficient current change according to light. Accordingly, when light is incident, electric charges generated in a photodiode are accumulated in a capacitor for a predetermined period of time and then a signal related to light intensity may be generated from the quantity of electric charges accumulated in the capacitor. When a capacitor is used as above, a sensing time may be delayed as long as the time for accumulating electric charges in a capacitor. Also, as the size of an optical touch screen device increases, parasitic capacitance may increase as well.

SUMMARY

Provided is a light sensing circuit using an oxide semiconductor transistor as a light sensing device, a light sensing apparatus including the light sensing circuit, a method of driving the light sensing apparatus, and an image acquisition apparatus and optical touch screen apparatus including the light sensing apparatus.

Additional aspects will be set forth in part in the description which follows and, in part, will be apparent from the description, or may be learned by practice of example embodiments.

According to example embodiments, a light sensing circuit may include an oxide semiconductor transistor including a channel layer including an oxide semiconductor material. The oxide semiconductor transistor may be configured to operate as a light sensing device that senses light and a switch that outputs light sensing data.

The light sensing circuit may further include a gate line connected to a gate of the oxide semiconductor transistor and configured to provide a gate voltage, a drive voltage line connected to a drain of the oxide semiconductor transistor and configured to provide a drive voltage, and a data line connected to a source of the oxide semiconductor transistor and configured to provide data.

The light sensing circuit may further include a gate driver configured to provide the gate voltage to the gate of the oxide semiconductor transistor via the gate line. The gate driver may be configured such that the gate voltage is any one of a first voltage that is lower than a first threshold voltage, a second voltage that is between the first threshold voltage and a second threshold voltage, and a third voltage that is positive, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

The light sensing circuit may further include a gate line connected to both of a gate and a drain of the oxide semiconductor transistor and configured to provide a gate voltage; and a data line connected to a source of the oxide semiconductor transistor and configured to provide data.

The oxide semiconductor transistor may include a substrate, a gate disposed on at least a portion of the substrate, a gate insulation film on the substrate and the gate to cover at least the gate, a channel layer disposed on the gate insulation film to face the gate, a source and a drain disposed to cover opposite sides of the channel layer, and a transparent insulation layer disposed to cover the source, the drain, and the channel layer, wherein the channel layer is formed on the gate insulation film and facing the gate.

The oxide semiconductor transistor may further include a first conductive plug that passes through the transparent insulation layer and is electrically connected to the source; a first contact on the transparent insulation that electrically contacts the first conductive plug; a second conductive plug that passes through the transparent insulation layer and is electrically connected to the drain; and a second contact on the transparent insulation layer that electrically contacts the second conductive plug.

The oxide semiconductor transistor may include a substrate; a gate insulation film on at least a central portion of the channel layer; a gate on the gate insulation film that faces the channel layer; a source and a drain on the channel layer at opposite sides of the gate, the source and drain each being separate from the gate; and a transparent insulation layer covering the gate, the source, and the drain, the channel layer being on the substrate.

The oxide semiconductor material may include one or more of ZnO, InO, SnO, InZnO, ZnSnO, or InSnO, or a material formed by adding at least one of Hf, Zr, Ti, Ta, Ga, Nb, V, Al, and Sn to one of ZnO, InO, SnO, InZnO, ZnSnO, or InSnO.

According to another aspect of the present invention, a light sensing apparatus may include a light sensing pixel array including a plurality of light sensing pixels arranged in a plurality of rows and a plurality of columns, and a gate driver including a plurality of gate lines arranged in a row direction, the gate driver being configured to provide a gate voltage and a reset signal to each of the plurality of light sensing pixels via the plurality of gate lines, wherein each of the plurality of light sensing pixels may include an oxide semiconductor transistor configured to operate as both a light sensing device that senses light and a switch that outputs light sensing data.

The gate driver may be configured to apply the gate voltage to the oxide semiconductor transistors sequentially in the row direction, and to apply the reset signal to all of the oxide semiconductor transistors at a time after applying the gate voltage to the oxide semiconductor transistors sequentially in the row direction.

The gate driver may provide each oxide semiconductor transistor with a first voltage that is lower than a first threshold voltage, a second voltage that is between the first threshold voltage and a second threshold voltage, and a third voltage that is positive, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

The gate driver may be configured to provide the gate voltage to each oxide semiconductor transistor in order of the first voltage, the second voltage, the first voltage, and the third voltage, and the third voltage is the reset signal to reset the oxide semiconductor transistor.

Each gate line may be connected light sensing pixels, from among the plurality of light sensing pixels that are in the same row.

Gates of the oxide semiconductor transistors of the plurality of light sensing pixels in a row may be connected to the gate line of the same row.

The light sensing apparatus may further include a signal output unit that includes a plurality of data lines arranged in a column direction, the signal output unit being configured to receive a light sensing signal from each of the plurality of light sensing pixel and output a data signal.

Sources of the oxide semiconductor transistors of the plurality of light sensing pixels in a column may be connected to the data line of the same column.

The signal output unit may include an A/D converter configured to convert analog signals output from the plurality of light sensing pixels into digital signals, a buffer configured to temporarily store the digital signals, and a column scanner configured to select an output from one of the plurality of light sensing pixels in a column.

According to another aspect of the present invention, an image acquisition apparatus includes the above light sensing circuit in a pixel.

According to another aspect of the present invention, an image acquisition apparatus include the above light sensing apparatus.

According to another aspect of the present invention, an optical touch screen apparatus includes a display apparatus configured to display an image, an optical touch panel attached on a screen of the display apparatus and including the above light sensing circuit in a pixel, and a light source apparatus configured to provide an optical signal to the optical touch panel.

According to another aspect of the present invention, an optical touch screen apparatus includes a display apparatus configured to display an image, an optical touch panel attached on a screen of the display apparatus and including the above light sensing apparatus, and a light source apparatus configured to provide an optical signal to the optical touch panel.

According to another aspect of the present invention, a method of driving a light sensing apparatus includes sequentially applying a negative (−) first voltage, a negative (−) second voltage that is higher than the first voltage, and a positive third voltage to a gate of an oxide semiconductor transistor that operates as both a light sensing device sensing light and a switch outputting light sensing data.

The first voltage may be lower than a first threshold voltage, and the second voltage may be between the first threshold voltage and a second threshold voltage, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

The third voltage may be a reset signal that resets the oxide semiconductor transistor.

The method may further include measuring current flowing between a drain and a source of the oxide semiconductor transistor during the application of the second voltage to a gate of the oxide semiconductor transistor.

According to another aspect of the present invention, a method of driving a light sensing apparatus includes the light sensing apparatus including a plurality of light sensing pixels being arranged in a plurality of rows and a plurality of columns, each of the light sensing pixels including an oxide semiconductor transistor that operates as both of a light sensing device sensing light and a switch outputting light sensing data, the method including applying a negative (−) second voltage to gates of the oxide semiconductor transistors of the plurality of light sensing pixels arranged in a row, from among the plurality of rows, and a negative (−) first voltage that is lower than the second voltage to the gates of the oxide semiconductor transistors arranged in the other rows from among the plurality of rows, sequentially applying the second voltage to the gates of the oxide semiconductor transistors of the plurality of light sensing pixels arranged in a next row from among the plurality of rows, and the first voltage to the gates of the oxide semiconductor transistors of the plurality of light sensing pixels arranged in the rows other than the next row from among the plurality of rows, and, simultaneously applying a positive third voltage to the gates of the oxide semiconductor transistors of the plurality of the light sensing pixels arranged in all the rows, after the sequential application of the second voltage to all rows is completed.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
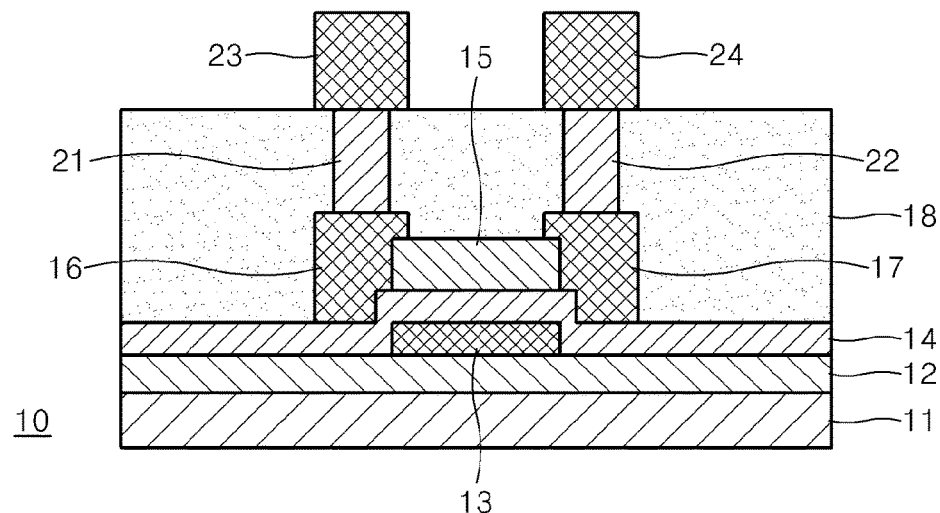
FIG. 1 is a cross-sectional view schematically illustrating a structure of an oxide semiconductor transistor used as a light sensing device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

An oxide semiconductor transistor is, for example, a transistor in which an oxide semiconductor is used as a material for a channel. The oxide semiconductor transistor may have a characteristic of being sensitive to light according to a material for an oxide semiconductor that is used as a channel layer. When an oxide semiconductor material having such a characteristic is used as a channel layer, an oxide semiconductor transistor may be characterized in that a threshold voltage and a drain current change according to a wavelength or light quantity of incident light. Accordingly, the oxide semiconductor transistor may be used as a light sensing device.

FIG. 1 is a cross-sectional view schematically illustrating a structure of an oxide semiconductor transistor 10 used as a light sensing device according to example embodiments. Referring to FIG. 1, the oxide semiconductor transistor 10 may include a substrate 11, an insulation layer 12 disposed on the substrate 11, a gate 13 disposed, for example partially, on the insulation layer 12, a gate insulation film 14 disposed on the insulation layer 12 and the gate 13 to cover at least the gate 13, a channel layer 15 disposed on the gate insulation film 14 to face the gate 13, a source 16 and a drain 17 disposed to cover the opposite sides of the channel layer 15, and a transparent insulation layer 18 disposed to cover the source 16, the drain 17, and the channel layer 15. Also, the oxide semiconductor transistor 10 may include a first conductive plug 21 electrically connected to the source 16 by passing through the transparent insulation layer 18 for electrical connection to the source 16, a first contact 23 formed on the transparent insulation layer 18 to electrically contact the first conductive plug 21, a second conductive plug 22 electrically connected to the drain 17 by passing through the transparent insulation layer 18 for electrical connection to the drain 17, and a second contact 24 formed on the transparent insulation layer 18 to electrically contact the second conductive plug 22.

The substrate 11 may use a general substrate material, for example, glass, silicon, or the like. The insulation layer 12, the gate insulation film 14, and the transparent insulation layer 18 may use a material such as $SiO_2$. When the substrate 11 is formed of an insulation material, the insulation layer 12 on the substrate 11 may be omitted. Also, the gate 13, the source 16, and the drain 17 may use a conductive metal or conductive metal oxide. For example, the oxide semiconductor transistor 10 that is sensitive to light may be used for an optical touch panel that is attached to a display panel, the gate 13, the source 16, and the drain 17 may be formed of a transparent conductive material such as indium tin oxide (ITO). However, when the oxide semiconductor transistor 10 is not transparent, materials for the substrate 11, the insulation layer 12, the gate 13, the gate insulation film 14, the source 16, and the drain 17 may not be transparent. According to example embodiments, only the transparent insulation layer 18 in the upper portion may be transparent in order to guide light toward the channel layer 15.

The channel layer 15 may be formed of an oxide semiconductor material, as described above. The oxide semiconductor transistor 10 may have a light sensitive characteristic according to an oxide semiconductor material for the channel layer 15. For example, an oxide semiconductor material such as ZnO, InO, SnO, InZnO, ZnSnO, and InSnO may be used as an oxide semiconductor channel material, or a material formed by adding at least one of Hf, Zr, Ti, Ta, Ga, Nb, V, Al, and Sn to the above-described oxide semiconductor material may be used as the oxide semiconductor channel material. When the above material is used for the channel layer 15, the oxide semiconductor transistor 10 of FIG. 1 may exhibit a threshold voltage and a drain current that change according to the wavelength or light quantity of incident light and may be used as a light sensing device. The channel layer 15 may be formed of a single oxide semiconductor layer or may have a multilayer structure.

FIG. 1 illustrates the oxide semiconductor transistor 10 having a bottom-gate structure in which a gate is arranged under a channel. However, according to example embodiments a light sensing device may include an oxide semiconductor transistor having a top-gate structure. For example, FIG. 2 is a cross-sectional view schematically illustrating a structure of an oxide semiconductor transistor 30 having a top-gate structure according to example embodiments.

Figure 2:
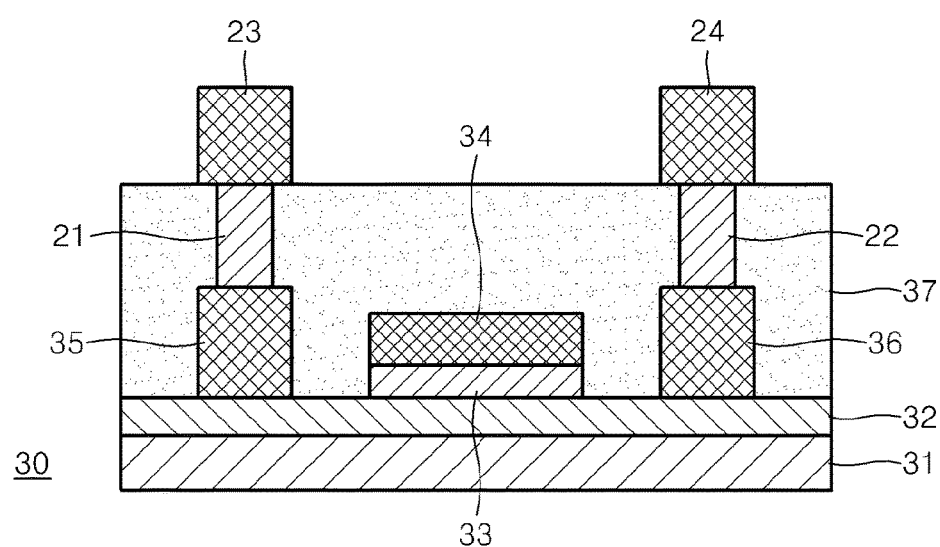
FIG. 2 is a cross-sectional view schematically illustrating a structure of an oxide semiconductor transistor used as a light sensing device according to example embodiments.

Referring to FIG. 2, according to example embodiments, the oxide semiconductor transistor 30 may include a substrate 31, a channel layer 32 disposed on the substrate 31, a gate insulation film 33 disposed, for example partially, on a central area of the channel layer 32, a gate 34 disposed on the gate insulation film 33 to face the channel layer 32, a source 35 and a drain 36 disposed on the channel layer 32 to be separated from the opposite sides of the gate 34, and a transparent insulation layer 37 disposed to cover the gate 34, the source 35, and the drain 36. According to example embodiments, In the oxide semiconductor transistor 30 having a top-gate structure of FIG. 2, in order for light to be incident upon the channel layer 32, the gate 34, the source 35, and the drain 36 may be formed of a transparent conductive material such as ITO. Also, the oxide semiconductor transistor 30 of FIG. 2 may further include the first conductive plug 21, the first contact 23, the second conductive plug 22, and the second contact 24.

Figure 3:
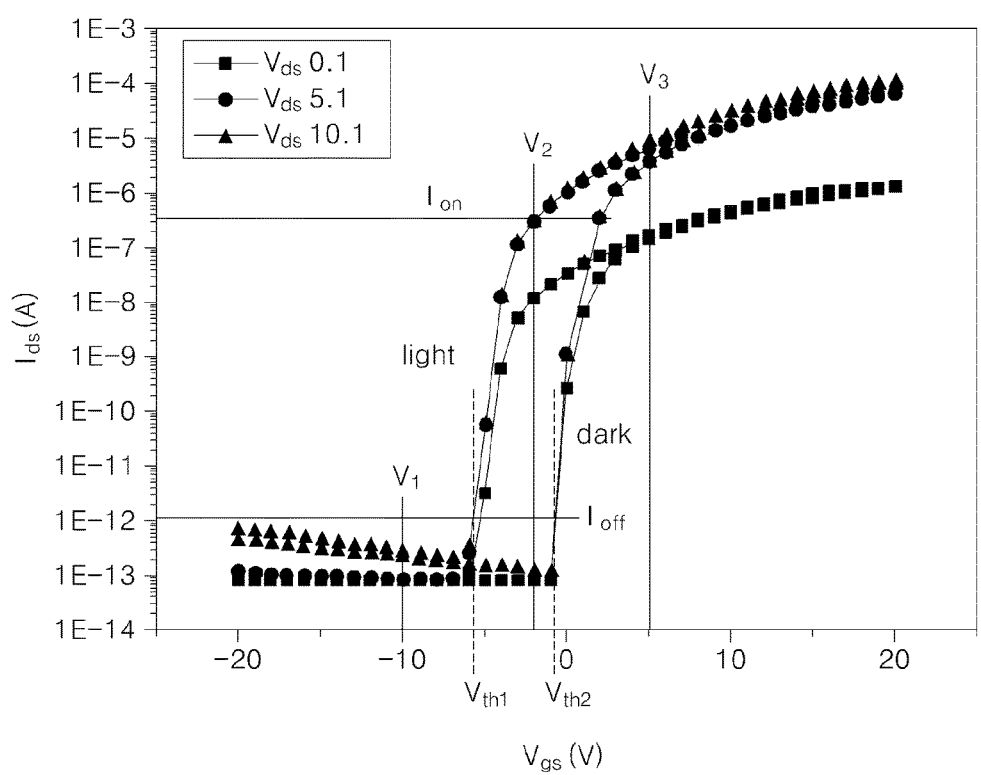
FIGS. 3 and 4 are graphs showing operation characteristics of the oxide semiconductor transistors of FIGS. 1 and 2.
Figure 4:
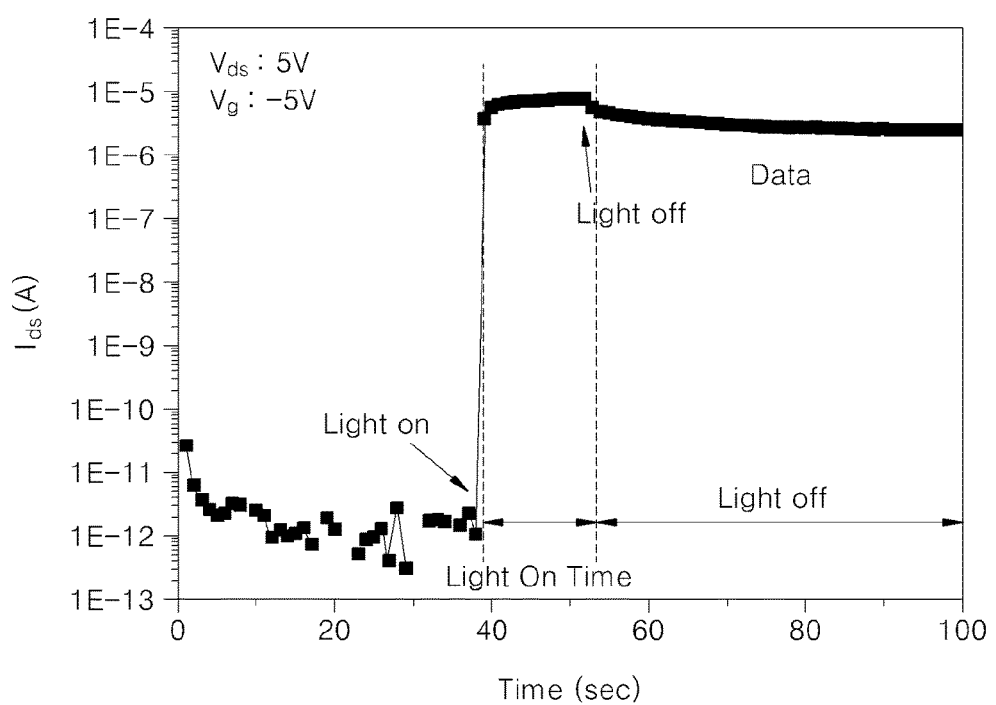

FIGS. 3 and 4 are graphs showing operation characteristics of the oxide semiconductor transistor 10 of FIG. 1 and the oxide semiconductor transistor 30 of FIG. 2 according to example embodiments. First, FIG. 3 shows a characteristic of a drain current Ids with respect to a gate voltage Vgs for either the oxide semiconductor transistor 10 illustrated in FIG. 2 or the oxide semiconductor 30 illustrated in FIG. 2. The characteristic is shown for drain-to-source voltages Vds of 0.1, 5.1 and 10.1.

FIG. 3 illustrates first and second threshold voltages Vth1 and Vth2. FIG. 3 also illustrates first through third voltages V1, V2 and V3. FIG. 3 illustrates a characteristic of a drain current vs. a gate voltage (Ids–Vgs) of the oxide semiconductor transistor 10 or 30 when light is not incident or an amount of incident light is at or below a reference level (indicated by the label 'dark' in FIG. 3), and when light is incident or an amount of incident light is at or above a second reference level (indicated by the label 'light' in FIG. 3). Referring to FIG. 3, when light is incident on the oxide semiconductor transistor 10 or 30, it can be seen that a threshold voltage may generally move in a negative direction, for example, based on an amount of the incident light. For example, in the example illustrated in FIG. 3, when light is not incident on the oxide semiconductor transistor or an amount of incident light is at or below a first reference level 10 or 30, the threshold voltage of the oxide semiconductor transistor 10 or 30 is equal to the second threshold voltage Vth2 and is changed to the first threshold voltage Vth1 when light is incident, for example, based on the amount of incident light. Thus, when a gate voltage equal to the second voltage V2 between the first threshold voltage Vth1 and the second threshold voltage Vth2 is applied to the oxide semiconductor transistor 10 or 30, in the 'dark' case, the oxide semiconductor transistor 10 or 30 is may be in an OFF state and thus a relatively low drain current may flow and, in the 'light' case, the oxide semiconductor transistor 10 or 30 is may be in an ON state and thus a relatively high drain current may flow. Further, when a gate voltage equal to the first voltage V1 is applied to the oxide semiconductor transistor 10 or 30, the oxide semiconductor transistor 10 or 30 is may always be in the OFF state regardless of the incidence of light. Also, when a gate voltage equal to the third voltage V3 higher than the first and second threshold voltages Vth1 and Vth2 is applied to the oxide semiconductor transistor 10 or 30, the oxide semiconductor transistor 10 or 30 is may always be in the ON state regardless of the incidence of light.

Thus, in a state in which a gate voltage equal to the second voltage V2 is applied to the oxide semiconductor transistor 10 or 30, the incidence of light may be determined by measuring the drain current. In particular, in the case of the oxide semiconductor transistor 10 or 30, it can be seen that a current ratio ($I_{ON}/I_{OFF}$) between the drain current when light is incident and the drain current when light is not incident, or below a reference level, may be about 5.2 ($\log_{10}(10^{-7.2}/10^{-12})$) which may be large compared to conventional silicon semiconductor photodiodes. When the oxide semiconductor transistor 10 or 30 having such a characteristic is used as a light sensing device, there may be a variety of advantages. For example, since a light sensitivity of the oxide semiconductor transistor 10 or 30 is high, when the oxide semiconductor transistor 10 or 30 is used as a light sensing device, a circuit structure of a light sensing pixel may be much simplified.

For a general silicon photodiode, since a current ratio is relatively low, electric charges generated from a photodiode when light is applied may be accumulated in a capacitor for a predetermined time and then a signal representing light intensity may be generated from the quantity of the electric charges accumulated in the capacitor. Thus, a separate data output and switching drive circuit may be needed to convert the electric charges accumulated in the capacitor into a light intensity signal and output. To this end, a photodiode, a capacitor, and at least one thin film transistor may be arranged for each light sensing pixel. Typically, 3 to 5 thin film transistors may be used for one light sensing pixel to amplify and output a signal without noise.

However, since light sensitivity of the oxide semiconductor transistor 10 of FIG. 1 or the oxide semiconductor transistor 30 of FIG. 2 may be comparatively higher or very high with respect to conventional photodiodes, there may be no need to accumulate electric charges in a capacitor for a predetermined time. Also, since the oxide semiconductor transistor 10 or 30 may be capable of performing a switch function by itself unlike a photodiode, a separate data output and switching drive circuit may not be necessary. Accordingly, the size of a light sensing apparatus using the switch function may be increased, a drive speed may be improved, and consumption of power may be reduced.

FIG. 4 is a graph showing a change in the drain current according to the passage of time after light is incident on the oxide semiconductor transistor 10 or the oxide semiconductor transistor 30, in which a gate voltage Vg of, for example, −5V, between the first and second threshold voltages Vth1 and Vth2, is applied to the oxide semiconductor transistor 10 or 30. In the example illustrated in FIG. 4, light becomes incident on the oxide semiconductor 10 from the 40 second point to approximately the 55 second point. In the example illustrated in FIG. 4, the drain current increases when light is incident on the oxide semiconductor transistor 10 or 30. However, even when the incidence of light discontinues at about 55 seconds, the drain current hardly decreases and rather maintains a similar state to a light incidence state. According to example embodiments, the oxide semiconductor transistor 10 or 30 has a sort of a memory function with respect to the incidence of light. This phenomenon may be understood as one in which electric charges are trapped in or on a boundary surface of the channel layer 15 of the oxide semiconductor transistor 10 or the channel layer 32 of the oxide semiconductor transistor 30. For example, when a negative gate voltage is applied with light to the oxide semiconductor transistor 10 or 30, holes generated by the light in the channel layer 15 or 32 are transferred to a boundary surface between the gate insulation film 14 or 33 and the channel layer 15 or 32 and may be trapped therein. The trapped electric charges may not be removed until a sufficiently large positive voltage is applied to the gate 13 or 34. Thus, once the electric charges are trapped, the drain current may not be lowered even after the incidence of light discontinues. Such a phenomenon may disappear when the trapped electric charges are removed by applying a sufficiently large gate voltage to the oxide semiconductor transistor 10 or 30.

Figure 5:
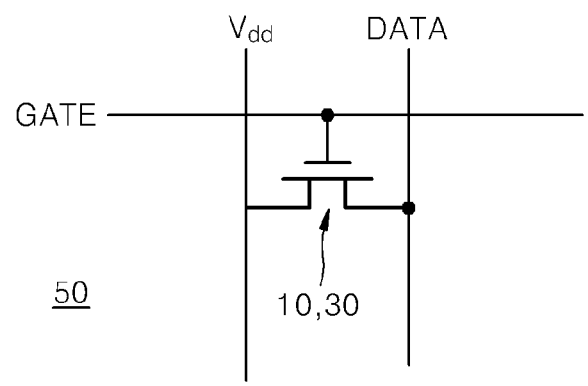
FIG. 5 is a circuit diagram illustrating a structure of a light sensing circuit according to example embodiments.

FIG. 5 is a circuit diagram illustrating a structure of a light sensing circuit 50 according to example embodiments. Referring to FIG. 5, the light sensing circuit 50 may include a single oxide semiconductor transistor 10 or 30 having light sensitivity, a gate line GATE connected to the gate 13 or 34 of the oxide semiconductor transistor 10 or 30, a drive voltage line Vdd connected to the drain 17 or 36 of the oxide semiconductor transistor 10 or 30, and a data line DATA connected to the source 16 or 35 of the oxide semiconductor transistor 10 or 30. The light sensing circuit 50 configured as above may be capable of performing a light sensing operation and a switching operation with the single oxide semiconductor transistor 10 or 30 only, as described below. FIG. 5 illustrates the light sensing circuit 50 having only one pixel for convenience of explanation. However, as described below, a plurality of light sensing circuits 50 for a plurality of pixels may be arranged along a plurality of gate lines GATE and a plurality of data lines DATA.

Figure 6:
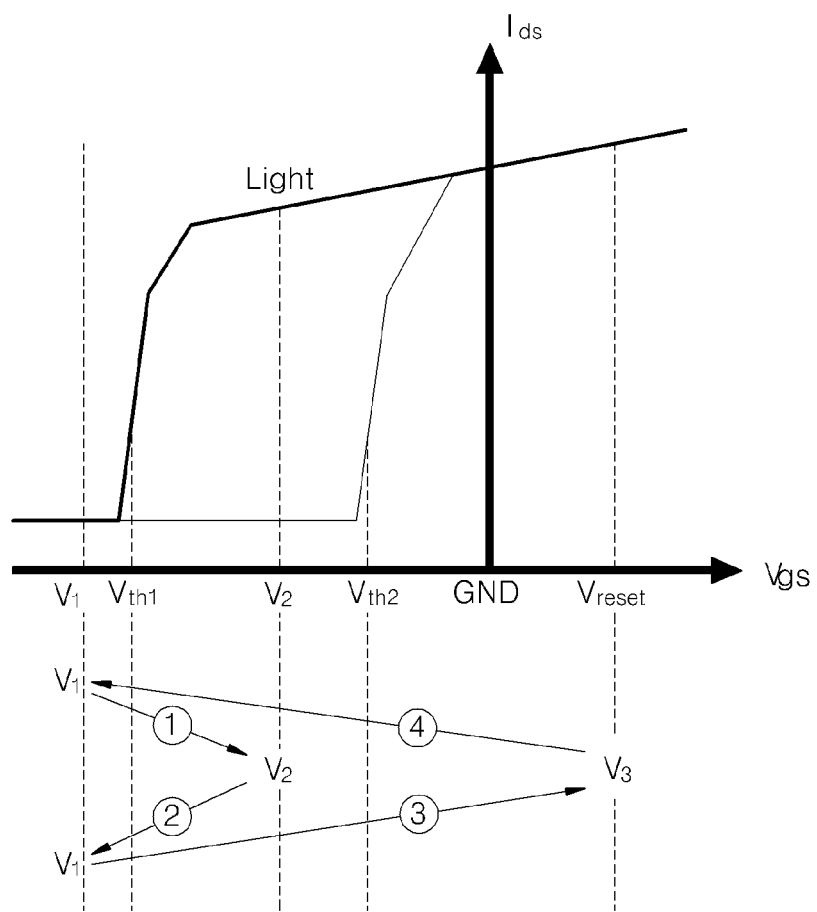
FIG. 6 schematically illustrates operation characteristics and a driving method of an oxide semiconductor transistor in the light sensing circuit of FIG. 5.

FIG. 6 schematically illustrates operation characteristics and a driving method of the oxide semiconductor transistor 10 or 30 in the light sensing circuit 50 of FIG. 5. Referring to FIG. 6, in a ready state, the first voltage V1 that is negative and lower than the first threshold voltage Vth1 when light is incident is applied to the gate 13 or 34 of the oxide semiconductor transistor 10 or 30 through the gate line GATE. Then, the oxide semiconductor transistor 10 or 30 is always in an OFF state regardless of the incidence of light. As a result, current does not flow from the drain 17 or 36 of the oxide semiconductor transistor 10 or 30 to the source 16 or 35 thereof. Thus, in the interim, current hardly flows to the data line DATA.

Next, during transition '1' illustrated in FIG. 6, for the output of a light sensing signal, the second voltage V2 that is negative and between the first threshold voltage Vth1, which is a threshold voltage during the incidence of light based on an amount of incident light, and the second threshold voltage Vth2, which is a threshold voltage during the non-incidence of light or the incidence of light below a first reference amount, is applied to the gate 13 or 34 of the oxide semiconductor transistor 10 or 30 through the gate line GATE. The second voltage V2 is higher than the first voltage V1. As illustrated in FIG. 6, the oxide semiconductor transistor 10 or 30 is in an ON state when light is incident and in an OFF state when light is not incident. Thus, when light is incident on the oxide semiconductor transistor 10 or 30, current flows from the drain 17 or 36 to the source 16 or 35. According to example embodiments, current may flow from the drive voltage line Vdd of the light sensing circuit 50 to the data line DATA. The amount of current flowing in the data line DATA may be proportional to the quantity or intensity of incident light. Thus, the existence of incident light and the quantity/intensity of incident light may be identified and calculated by measuring the current flowing toward the data line DATA during when the second voltage V2 is applied to the gate 13 or 34 of the oxide semiconductor transistor 10 or 30. In particular, in order to improve light sensitivity, the second voltage V2 may be selected between the first threshold voltage Vth1 and the second threshold voltage Vth2 to be closer to the second threshold voltage Vth2. When the output of a light sensing signal is completed, during transition '2' illustrated in FIG. 6, the first voltage V1 is applied again to the gate 13 or 34 of the oxide semiconductor transistor 10 or 30 via the gate line GATE. Then, the oxide semiconductor transistor 10 or 30 is in an OFF state regardless of the existence of incident light.

As described above with reference to FIG. 4, once light is incident, the drain current in the oxide semiconductor transistor 10 or 30 is not lowered even when the incidence of light discontinues. Accordingly, after the output of a light sensing signal, for a next light sensing operation, an operation to reset the oxide semiconductor transistor 10 or 30 is performed by applying a sufficiently large amount of a gate voltage to the oxide semiconductor transistor 10 or 30. For example, referring to FIG. 6, during transition '3' illustrated in FIG. 6, a sufficiently large amount of the third voltage V3 is applied to the gate 13 or 34 of the oxide semiconductor transistor 10 or 30 via the gate line GATE. Then, the oxide semiconductor transistor 10 or 30 is reset and thus the next light sensing operation may be performed. Thereafter, during transition '4' illustrated in FIG. 6, the oxide semiconductor transistor 10 or 30 is in a ready state while the first voltage V1 is applied again to the gate 13 or 34 of the oxide semiconductor transistor 10 or 30 until the next light sensing operation is performed.

When the second voltage V2 is applied sequentially to the gate lines GATE using the above principle, the pixel or pixels upon which light is incident among a plurality of pixels may be identified. As described above, in the light sensing circuit 50 according to example embodiments, one oxide semiconductor transistor 10 or 30 may perform both of light sensing and data output. According to example embodiments, the oxide semiconductor transistor 10 or 30 may simultaneously function as a light sensing device and a drive circuit. Thus, it is possible to provide the light sensing circuit 50 having a structure that is very simplified as illustrated in FIG. 5.

Figure 7:
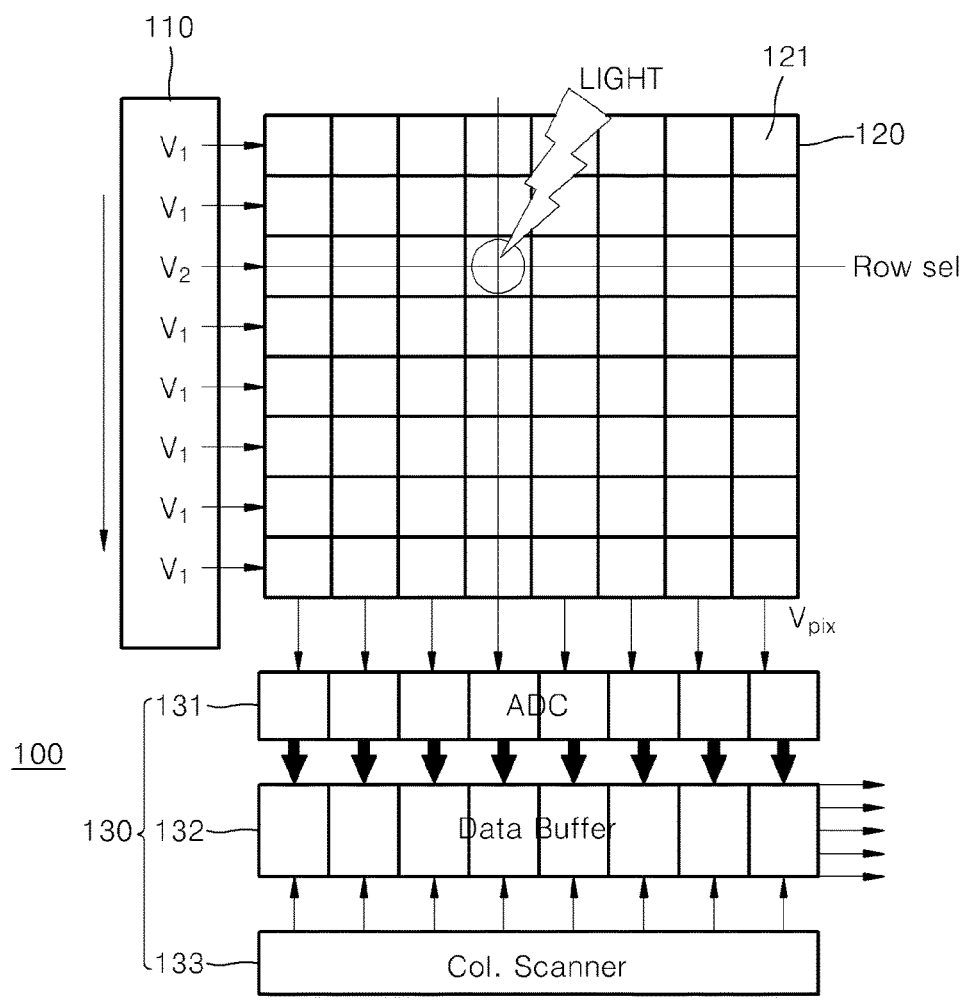
FIG. 7 is a block diagram schematically illustrating a structure of a light sensing apparatus according to example embodiments including the light sensing circuit of FIG. 5.

The light sensing circuit 50 may be used for each pixel structure of a light sensing apparatus such as a light touch screen apparatus or an image acquisition apparatus. FIG. 7 is a block diagram schematically illustrating a structure of a light sensing apparatus 100 according to example embodiments including the light sensing circuit 50 of FIG. 5. Referring to FIG. 7, the light sensing apparatus 100 according to example embodiments may include a light sensing pixel array 120 having a plurality of light sensing pixels 121 for sensing incident light, a gate driver 110 that selectively supplies a gate voltage and a reset signal to each of the light sensing pixels 121, and a signal output unit 130 that receives a light sensing signal from each of the light sensing pixels 121 and outputs a data signal. As illustrated in FIG. 7, the light sensing pixels 121 of the light sensing pixel array 120 may be arranged in a plurality of rows and a plurality of columns. For example, the light sensing pixels 121 may be arranged in an array of n-numbered rows and m-numbered columns. Each of the light sensing pixels 121 may be formed of a single oxide semiconductor transistor 10 or 30, as illustrated in FIG. 5. Also, the signal output unit 130 may include an analog-to-digital (A/D) converter 131 for converting an analog output signal of the light sensing pixels 121 into a digital signal, a data buffer 132 for temporarily storing the digital output signal, and a column scanner 133 for selecting an output from the light sensing pixels 121 of a particular column.

Figure 8:
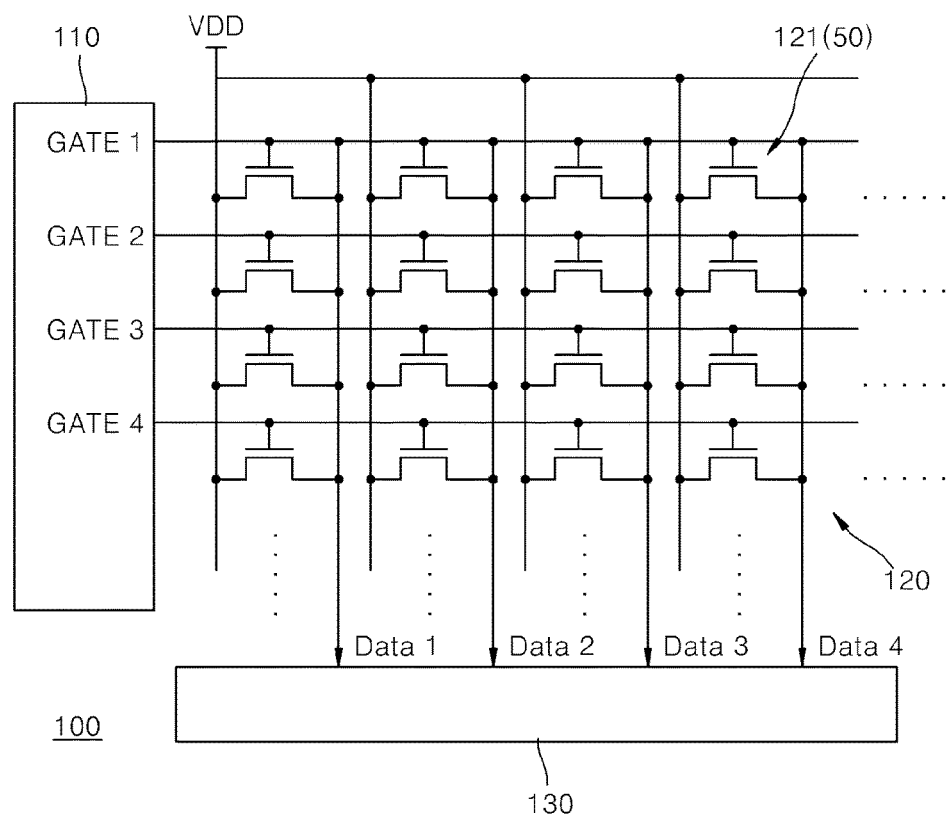
FIG. 8 schematically illustrates a structure of a light sensing pixel array of the light sensing apparatus of FIG. 7.

FIG. 8 schematically illustrates a structure of the light sensing pixel array 120 of the light sensing apparatus 100 of FIG. 7. For example, referring to FIG. 8, the light sensing circuit 50 of FIG. 5 is illustrated as being arranged in each of the light sensing pixels 121. However, instead of the light sensing circuit 50 of FIG. 5, a light sensing circuit 60 of FIG. 10 may be arranged in each of the light sensing pixels 121.

Referring to FIGS. 7 and 8, the gate driver 110 may selectively activate each of the light sensing pixels 121 to control each of the light sensing pixels 121 to output a light sensing signal. To this end, the gate driver 110 may include a plurality of gate lines GATE1, GATE2, . . . , which are arranged in a row direction. Each gate line may be connected to the gates 13 or 34 of the oxide semiconductor transistor 10 or 30 in all of the light sensing pixels 121 arranged in the same row. For example, the first gate line GATE1 may be connected to the gates 13 or 34 of the oxide semiconductor transistor 10 or 30 in all of the light sensing pixels 121 arranged in the first row, and the second gate line GATE2 may be connected to the gates 13 or 34 of the oxide semiconductor transistor 10 or 30 in all of the light sensing pixels 121 arranged in the second row.

The signal output unit 130 may receive a light sensing signal generated from each of the light sensing pixels 121 and output a data signal. To this end, the signal output unit 130 may include a plurality of data lines Data1, Data2, . . . , which are arranged in a column direction. Each of the data lines Data1, Data2, . . . , may be connected to the source 16 or 35 of the oxide semiconductor transistor 10 or 30 in all of the light sensing pixels 121 arranged in the same column. For example, the first data line Data1 may be connected to the source 16 or 35 of the oxide semiconductor transistor 10 or 30 in all of the light sensing pixels 121 arranged in the first column, and the second data line Data2 may be connected to the source 16 or 35 of the oxide semiconductor transistor 10 or 30 in all of the light sensing pixels 121 arranged in the second column.

In the above-described structure, the signal output unit 130 may simultaneously receive all light sensing signal generated from the light sensing pixels 121 arranged in the same row through the data lines Data1, Data2, . . . . For example, when a gate voltage V2 is applied to the first gate line GATE1, all light sensing signals generated from the light sensing pixels 121 arranged in the first row may be simultaneously input to the signal output unit 130.

The signal output unit 130 may be configured to convert the light sensing signals into digital data signals and sequentially output the digital data signals column by column. For example, the output of each of the light sensing pixels 121 is provided to the A/D converter 131 via the corresponding data line DATA which may be connected top the signal output unit 130. A signal from each of the light sensing pixels 121 may have a high amplitude during the incidence of light and low amplitude, for example, close to 0, during the non-incidence of light. Since the signal at this time is an analog signal, the signal is converted into a digital signal by the A/D converter 131. The digital output converted by the A/D converter 131 may be provided to the data butter 132 and stored therein. Then, the column scanner 133 may select a particular column such that only a digital signal of the selected column is output according to the selection of the column scanner 133. For example, FIG. 7 illustrates that a signal of the light sensing pixel 121 located at the third row and fourth column may be selected and output from the buffer 132.

Figure 9:
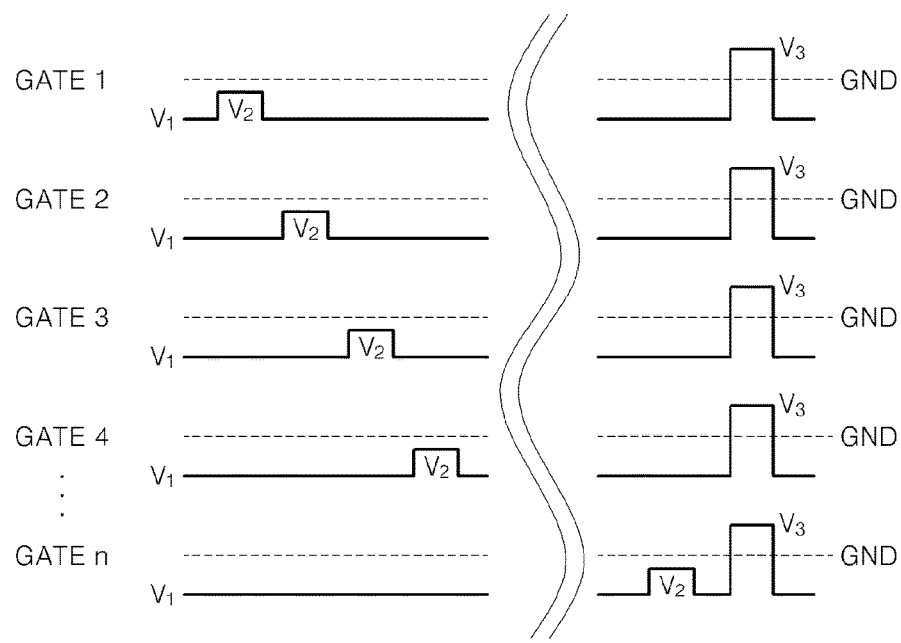
FIG. 9 is a timing diagram showing a method of driving the light sensing apparatus of FIG. 7.

The following description discusses the operation of the above-described light sensing apparatus 100 according to example embodiments. FIG. 9 is a timing diagram showing a method of driving the light sensing apparatus 100 of FIG. 7. Referring to a timing diagram of FIG. 9, first, the gate driver 110 may apply a gate voltage equal to a second voltage V2 between the first and second threshold voltages Vth1 and Vth2 of the oxide semiconductor transistor 10 or 30 to the first gate line GATE1 so that a light sensing signal is output from the light sensing pixels 121 in the first row. A low voltage equal to a first voltage V1 may be applied to the other gate lines GATE2, . . . . Thus, light sensing signals may not be generated from the light sensing pixels 121 in the other rows. Then, the gate driver 110 may apply a gate voltage V2 to the second gate line GATE2 so that a light sensing signal is output from the light sensing pixels 121 in the second row. A low voltage V1 may be applied to the other gate lines GATE1, GATE3, . . . . Thus, light sensing signals may be output from the light sensing pixels 121 in order from the first row to the last row of the light sensing pixel array 120 in this manner.

Then, the gate driver 110 may apply a positive reset signal equal to a third voltage V3 to all of the gate lines GATE1, GATE2, . . . to reset the oxide semiconductor transistor 10 or 30 of all of the light sensing pixels 121 in the light sensing pixel array 120. Accordingly, the oxide semiconductor transistor 10 or 30 is initialized so that a next light sensing operation may be performed. As a result, a light sensing operation of one frame is completed. When a light sensing operation of one frame is completed, a light sensing operation of a next frame may be repeated in the same order as that described above.

Figure 10:
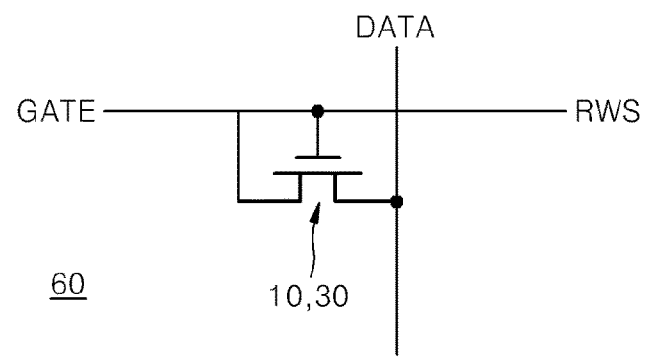
FIG. 10 is a circuit diagram illustrating a structure of a light sensing circuit according to example embodiments.
Figure 11:
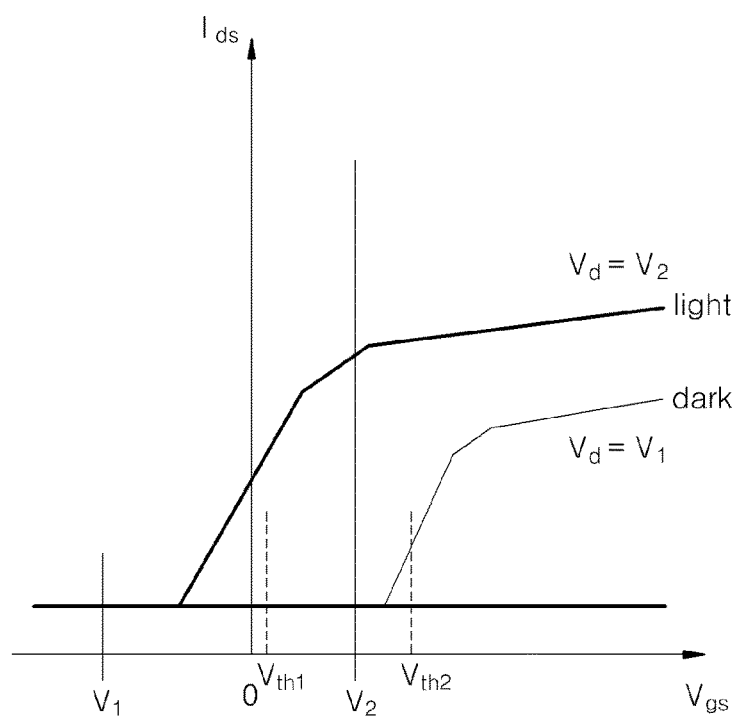
FIG. 11 schematically illustrates operation characteristics and a driving method of an oxide semiconductor transistor in the light sensing circuit of FIG. 10.

FIG. 10 is a circuit diagram illustrating a structure of a light sensing circuit 60 according to example embodiments. FIG. 11 schematically illustrates operation characteristics and a driving method of an oxide semiconductor transistor in the light sensing circuit 60 of FIG. 10 according to example embodiments. As it can be seen from the characteristic graph in the example illustrated in FIG. 11, in the oxide semiconductor transistor 10 or 30 used in the light sensing circuit 60 of FIG. 10, the first threshold voltage Vth1 during the incidence of light is a negative voltage and the second threshold voltage Vth2 during the non-incidence of light, or the incidence of light below a reference amount, is a positive voltage. Such a threshold voltage characteristic may be selected according to, for example, the material for the channel layer 15 or 32. When the second threshold voltage Vth2 is a positive voltage, the second voltage V2 provided to the gates 13 or 34 of the oxide semiconductor transistor 10 or 30 via the gate line GATE may be a positive voltage. In this case, without applying a separate drive voltage Vdd to the drain 17 or 36 of the oxide semiconductor transistor 10 or 30, the second voltage V2 applied to the gates 13 or 34 may be used as a drive voltage. Thus, the light sensing circuit 60 of FIG. 10 may not separately include a drive voltage Vdd line. The gate line GATE may be simultaneously connected to the gates 13 or 34 and the drain 17 or 36 of the oxide semiconductor transistor 10 or 30. The other structure and operation of the light sensing circuit 60 of FIG. 10 may be the same as those of the light sensing circuit 50 of FIG. 5.

As described above, each of the light sensing pixels 121 of the light sensing apparatus 100 according to example embodiments may simply include only one oxide semiconductor transistor 10 or 30. In the light sensing apparatus 100, the oxide semiconductor transistor 10 or 30 may function not only as a light sensor but also as a switch to output a light sensing signal. Thus, compared to a conventional light sensing apparatus which may have a more complicated circuit structure in which a plurality of transistors and capacitors are installed in one pixel, the structure and operation of the light sensing apparatus 100 according to example embodiments may be much simplified. Accordingly, the light sensing apparatus 100 may be manufactured in a large size overcoming a design limit due to parasitic resistance and parasitic capacitance. Also, an aperture ratio may be improved due to a simplified pixel structure so that sensitivity and resolution of the light sensing apparatus 100 may be improved.

Figure 12:
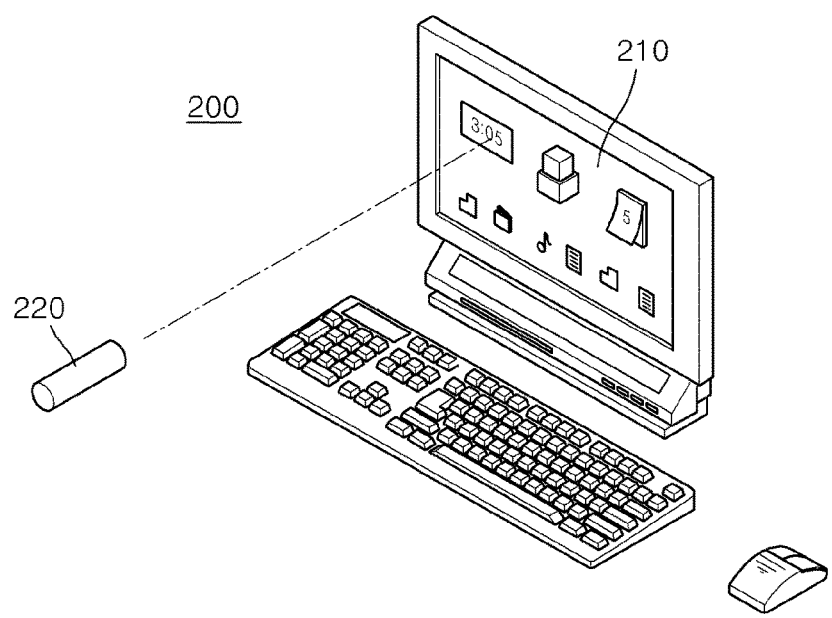
FIG. 12 is a perspective view of an optical touch screen apparatus according to example embodiments in which the light sensing apparatus of FIG. 7 is used as a light touch panel.

FIG. 12 is a perspective view of an optical touch screen apparatus 200 according to example embodiments in which the light sensing apparatus 100 of FIG. 7 is used, for example, as a light touch panel. Referring to FIG. 12, the optical touch screen apparatus 200 may include a display apparatus 210 in which an optical touch panel formed of the above-described light sensing apparatus 100 is attached to a screen. In the optical touch screen apparatus 200, when light is irradiated to the display apparatus 210 by using a light source apparatus 220 such as a laser pointer, the light sensing pixels 121 arranged in the light sensing apparatus 100 recognize the light. Thus, the same effect as one such as touching a touch screen with a finger or a stylus may be obtained.

The above descriptions focus on the application, to the optical touch screen apparatus 200, of the light sensing apparatus 100 including the light sensing circuit 50 or 60 using the oxide semiconductor transistor 10 or 30. However, the above-described light sensing apparatus 100 may be applied not only to the optical touch screen apparatus 200, but also to other apparatuses including, for example, any or all apparatuses for sensing light. For example, the above-described light sensing apparatus 100 may be applied to an image acquisition apparatus such as a CMOS image sensor or a CCD.

As described above, according to example embodiments, a light sensing circuit having a simplified structure, a light sensing apparatus including the light sensing circuit, a method of driving the light sensing apparatus, and an image acquisition apparatus and optical touch screen apparatus including the light sensing apparatus, are described and illustrated. It should be understood example embodiments described therein should be considered in a descriptive sense only and not for purposes of limitation. Descriptions of features or aspects within example embodiments should typically be considered as available for other similar features or aspects in other example embodiments.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A light sensing circuit, comprising:
an oxide semiconductor transistor including a channel layer including an oxide semiconductor material;
a gate line directly connected to a gate of the oxide semiconductor transistor and configured to provide a gate voltage;
a drive voltage line directly connected to a drain of the oxide semiconductor transistor and configured to provide a drive voltage; and
a data line directly connected to a source of the oxide semiconductor transistor and configured to provide data,
wherein the oxide semiconductor transistor is configured to operate as both a light sensing device that senses light and a switch that outputs light sensing data in response to the sensed light without accumulating charges associated with the incident light in a capacitor.

2. The light sensing circuit of claim 1, further comprising:
a gate driver configured to provide the gate voltage to the gate of the oxide semiconductor transistor via the gate line,
wherein the gate driver is configured such that the gate voltage is any one of a first voltage that is lower than a first threshold voltage, a second voltage that is between the first threshold voltage and a second threshold voltage, and a third voltage that is positive, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

3. An image acquisition apparatus, comprising:
the light sensing circuit of claim 1 in a pixel.

4. An optical touch screen apparatus, comprising:
a display apparatus configured to display an image;
an optical touch panel attached on a screen of the display apparatus, the optical touch panel including the light sensing circuit of claim 1 in a pixel; and a light source apparatus configured to provide an optical signal to the optical touch panel.

5. The light sensing circuit of claim 1, wherein the oxide semiconductor transistor further includes,
a substrate;
a gate on at least a portion of the substrate;
a gate insulation film on the substrate and the gate to cover at least the gate;
a source and a drain on opposite sides of the channel layer; and
a transparent insulation layer covering the source, the drain, and the channel layer,
wherein the channel layer is on the gate insulation film and facing the gate.

6. The light sensing circuit of claim 5, wherein the oxide semiconductor transistor further includes,
a first conductive plug that passes through the transparent insulation layer and is electrically connected to the source;
a first contact on the transparent insulation that electrically contacts the first conductive plug;
a second conductive plug that passes through the transparent insulation layer and is electrically connected to the drain; and
a second contact on the transparent insulation layer that electrically contacts the second conductive plug.

7. The light sensing circuit of claim 1, wherein the oxide semiconductor transistor comprises:
a substrate;
a gate insulation film on at least a central portion of the channel layer;
a gate on the gate insulation film that faces the channel layer;
a source and a drain on the channel layer at opposite sides of the gate, the source and drain each being separate from the gate; and
a transparent insulation layer covering the gate, the source, and the drain,
wherein the channel layer is on the substrate.

8. The light sensing circuit of claim 1, wherein the oxide semiconductor material includes one or more of ZnO, InO, SnO, InZnO, ZnSnO, or InSnO, or a material formed by adding at least one of Hf, Zr, Ti, Ta, Ga, Nb, V, Al, and Sn to one of ZnO, InO, SnO, InZnO, ZnSnO, or InSnO.

9. A light sensing apparatus, comprising:
a light sensing pixel array including a plurality of light sensing pixels in a plurality of rows and a plurality of columns; and
a gate driver including a plurality of gate lines in a row direction, the gate driver being configured to provide a gate voltage and a reset signal to each of the plurality of light sensing pixels via the plurality of gate lines,
wherein each of the plurality of light sensing pixels includes:
an oxide semiconductor transistor configured to operate as both a light sensing device that senses light and a switch that outputs light sensing data in response to the sensed light without accumulating charges associated with the incident light, in a capacitor;
one of the plurality of gate lines being directly connected to a gate of the oxide semiconductor transistor and configured to provide a gate voltage;
a drive voltage line directly connected to a drain of the oxide semiconductor transistor and configured to provide a drive voltage; and
a data line directly connected to a source of the oxide semiconductor transistor and configured to provide data.

10. The light sensing apparatus of claim 9, wherein the gate driver is configured to,
apply the gate voltage to the oxide semiconductor transistors sequentially in the row direction, and
apply the reset signal to all of the oxide semiconductor transistors at a time after applying the gate voltage to the oxide semiconductor transistors sequentially in the row direction.

11. The light sensing apparatus of claim 9, wherein each gate line is connected to light sensing pixels, from among the plurality of light sensing pixels, that are in the same row.

12. The light sensing apparatus of claim 9, wherein the oxide semiconductor transistor comprises:
a substrate;
a channel layer on the substrate;
a gate insulation film on at least a central portion of the channel layer;
a gate on the gate insulation film that faces the channel layer;
a source and a drain on the channel layer at opposite sides of the gate, the source and drain each being separate from the gate; and
a transparent insulation layer covering the gate, the source, and the drain,
wherein the channel layer is formed of an oxide semiconductor material.

13. An image acquisition apparatus, comprising:
the light sensing apparatus of claim 9.

14. An optical touch screen apparatus, comprising:
a display apparatus configured to display an image;
an optical touch panel attached on a screen of the display apparatus, the optical touch panel including the light sensing apparatus of claim 9; and
a light source apparatus configured to provide an optical signal to the optical touch panel.

15. The light sensing apparatus of claim 9, wherein the gate driver is configured to provide each oxide semiconductor transistor with a first voltage that is lower than a first threshold voltage, a second voltage that is between the first threshold voltage and a second threshold voltage, and a third voltage that is positive, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

16. The light sensing apparatus of claim 15, wherein the gate driver is configured to provide the gate voltage to each oxide semiconductor transistor in order of the first voltage, the second voltage, the first voltage, and the third voltage, and the third voltage is the reset signal to reset the oxide semiconductor transistor.

17. The light sensing apparatus of claim 9, further comprising:
a signal output unit that includes a plurality of data lines in a column direction, the signal output unit being configured to receive a light sensing signal from each of the plurality of light sensing pixels and output a data signal.

18. The light sensing apparatus of claim 17, wherein the signal output unit includes,
an A/D converter configured to convert analog signals output from the plurality of light sensing pixels into digital signals;

a buffer configured to temporarily store the digital signals; and a column scanner configured to select an output from one of the plurality of light sensing pixels in a column.

19. The light sensing apparatus of claim 9, wherein the oxide semiconductor transistor comprises:

a substrate;

a gate on at least a portion of the substrate;

a gate insulation film on the substrate and the gate that covers at least the gate;

a channel layer on the gate insulation film and facing the gate;

a source and a drain on opposite sides of the channel layer, respectively; and a transparent insulation layer covering the source, the drain, and the channel layer, wherein the channel layer is formed of an oxide semiconductor material.

20. The light sensing apparatus of claim 19, wherein the oxide semiconductor material includes one or more of ZnO, InO, SnO, InZnO, ZnSnO, or InSnO, or a material formed by adding at least one of Hf, Zr, Ti, Ta, Ga, Nb, V, Al, and Sn to one of ZnO, InO, SnO, InZnO, ZnSnO, or InSnO.

21. A method of driving the light sensing apparatus of claim 9, the method comprising:

sequentially applying a negative first voltage, a negative second voltage that is higher than the negative first voltage, and a positive third voltage to a gate of an oxide semiconductor transistor that operates as both a light sensing device sensing light and a switch outputting light sensing data in response to the sensed light without accumulating charges associated with the incident light, in a capacitor.

22. The method of claim 21, wherein the negative first voltage is lower than a first threshold voltage, and the negative second voltage is between the first threshold voltage and a second threshold voltage, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

23. The method of claim 22, wherein the positive third voltage is a reset signal that resets the oxide semiconductor transistor.

24. The method of claim 22, further comprising:

measuring current flowing between a drain and a source of the oxide semiconductor transistor during the application of the negative second voltage to a gate of the oxide semiconductor transistor.

25. A method of driving a light sensing apparatus, the light sensing apparatus comprising a plurality of light sensing pixels in a plurality of rows and a plurality of columns, each of the light sensing pixels including an oxide semiconductor transistor that operates as both a light sensing device sensing light and a switch outputting light sensing data, a gate line directly connected to a gate of the oxide semiconductor transistor and configured to provide a gate voltage, a drive voltage line directly connected to a drain of the oxide semiconductor transistor and configured to provide a drive voltage, and a data line directly connected to a source of the oxide semiconductor, the method comprising:

applying a negative first voltage to gates of the oxide semiconductor transistors of the plurality of light sensing pixels in a row from among the plurality of rows, and a negative second voltage that is lower than the negative first voltage to the gates of the oxide semiconductor transistors in other rows from among the plurality of rows;

sequentially applying the negative first voltage to the gates of the oxide semiconductor transistors of the plurality of light sensing pixels in a next row from among the plurality or rows, and applying the negative second voltage to the gates of the oxide semiconductor transistors of the plurality of light sensing pixels in rows other than the next row from among the plurality of rows; and simultaneously applying a positive third voltage to the gates of the oxide semiconductor transistors of the plurality of the light sensing pixels in all the rows, after the sequential application of the negative first voltage to all rows is completed, wherein the light sensing data is outputted, in response to the sensed light, without accumulating charges associated with the incident light, in a capacitor.

26. The method of claim 25, wherein the negative second voltage is lower than a first threshold voltage, and the negative first voltage is between the first threshold voltage and a second threshold voltage, the first threshold voltage being a threshold voltage of the oxide semiconductor transistor when light is incident on the oxide semiconductor transistor, the second threshold voltage being a threshold voltage of the oxide semiconductor transistor when light not incident on the oxide semiconductor transistor.

27. The method of claim 26, wherein the positive third voltage is a reset signal that resets the oxide semiconductor transistor.

28. The method of claim 26, further comprising:

measuring current flowing between a drain and a source of the oxide semiconductor transistor during the application of the negative first voltage to a gate of the oxide semiconductor transistor.

* * * * *